United States Patent
Giri et al.

[19]

[11] Patent Number: 6,037,044
[45] Date of Patent: Mar. 14, 2000

[54] DIRECT DEPOSIT THIN FILM SINGLE/MULTI CHIP MODULE

[75] Inventors: Ajay P. Giri, Poughkeepsie; Sundar M. Kamath, Hyde Park; Daniel P. O'Connor, Poughkeepsie, all of N.Y.; Rajesh B. Patel, Fremont, Calif.; Herbert I. Stoller; Lisa M. Studzinski, both of Wappingers Falls, N.Y.; Paul R. Walling, Lagrangeville, N.Y.

[73] Assignee: International Business Machines Corporation, Armonk, N.Y.

[21] Appl. No.: 09/004,690

[22] Filed: Jan. 8, 1998

[51] Int. Cl.[7] ................................. B32B 3/00; H05K 1/03
[52] U.S. Cl. ..................... 428/209; 428/469; 428/472; 428/702; 428/901; 174/255; 361/791; 361/795
[58] Field of Search ..................................... 428/469, 209, 428/472, 626, 699, 702, 901; 361/780, 791, 792–795; 174/255

[56] References Cited

U.S. PATENT DOCUMENTS

| | | |
|---|---|---|
| 4,622,095 | 11/1986 | Grobman et al. . |
| 4,945,399 | 7/1990 | Brown et al. ................................ 357/74 |
| 4,995,941 | 2/1991 | Nelson et al. . |
| 5,061,552 | 10/1991 | Satou . |
| 5,095,402 | 3/1992 | Hernandez et al. ..................... 361/306 |
| 5,221,426 | 6/1993 | Tessier et al. . |
| 5,329,695 | 7/1994 | Traskos et al. . |
| 5,635,761 | 6/1997 | Cao et al. ................................ 257/700 |
| 5,699,234 | 12/1997 | Saia et al. ................................ 361/790 |
| 5,894,410 | 4/1999 | Barrow ..................................... 361/760 |

Primary Examiner—Timothy M. Speer
Assistant Examiner—Bryant Young
Attorney, Agent, or Firm—Whitham, Curtis & Whitham; Tiffany L. Townsend

[57] ABSTRACT

A high performance TF-ceramic module for mounting integrated circuit chips thereto and a method of fabricating the module at reduced cost. The substrate includes thin film (TF) layers formed directly on a layered ceramic base. A first thick film wiring layer is formed on or embedded in a top surface of the thick film layered ceramic base using thick film techniques. A first dielectric layer of a polyimide or other organic material, or an insulating material different than the ceramic material is formed on top of the first wiring layer. The dielectric layer may be spun on or sprayed on and baked; vapor deposited; laminated to the ceramic base; or an inorganic layer may be deposited using plasma enhanced chemical vapor deposition (PECVD). Vias are formed through the first dielectric layer. A second wiring layer is formed on the first dielectric layer. A second dielectric layer is formed on the second wiring layer. At least one mounting location suitable for mounting an electronic component is formed on the second dielectric layer. The substrate may be attached a printed circuit board by direct attachment, pin grid array (PGA), land grid array (LGA), ball arid array (BGA), column grid array (CGA) and miniBGA on the bottom layer of the ceramic base.

24 Claims, 4 Drawing Sheets

DIRECT DEPOSIT THIN FILM SINGLE/MULTI CHIP MODULE

BACKGROUND OF THE INVENTION

1. Field of the Invention

The present invention is related to Integrated circuit (IC) chip packaging and, more particularly, to high signal density IC chip packaging for packaging single or multiple ICs in a single module and the method of manufacture thereof.

2. Background Description

Performance and signal density demands are forcing Single chip modules (SCMs) and, especially, multi-chip modules (MCMs) to become more and more complex. Ceramic module signal density is being increased by increasing the number of ceramic wiring layers (with one wiring or power layer on each ceramic layer). However, increasing signal density, increases signal load capacitance and impairs chip performance.

Thin film (TF) wiring layers on ceramic substrates have increased module wiring density and improved signal transmission characteristics, while dramatically reducing the number of ceramic layers. However, these modules require reference voltage layers for noise reduction and, when required, for impedance matching.

Typically, these ceramic modules include at least two TF layers for defining capture pads, a ground plane layer, and wiring layer. Unfortunately, these TF processes adapted for making such a module are very expensive because they require a planar ceramic substrate surface.

Thus, new cost effective methods are needed to reduce the TF ceramic fabrication costs.

SUMMARY OF THE INVENTION

It is a purpose of the invention to improve the performance of densely wired multi-chip and single chip modules.

It is another purpose of the present invention to reduce the cost for multi chip and single chip ceramic modules that include thin film wiring layers.

The present invention is a high performance module and method of fabricating the module. The module may be a single chip module (SCM) or a multi-chip module (MCM). The preferred module structure includes both thick and thin film layers. In one preferred embodiment, metal layers on top of ceramic substrates are directly deposited by thick film or ceramic processes. Then, redistribution layers are defined by thin film processes.

The thin film (TF) layers are formed directly on a layered ceramic base. A first wiring layer is formed on or embedded in a top surface of the layered ceramic base. A first dielectric layer of a polyimide or other organic material, or, is formed on top of the first wiring layer. Alternatively, the first dielectric layer may be an inorganic material different than the ceramic material. The dielectric layer, preferably, is spun on or sprayed on and baked. Alternatively, the dielectric layer may be laminated to the ceramic base; or, an inorganic layer may be vapor deposited using plasma enhanced chemical vapor deposition (PECVD) or, by evaporation or sputtering. Vias are formed through the first dielectric layer. A second wiring layer is formed on the first dielectric layer. Then, a passivation layer, or second dielectric layer, is formed on the second wiring layer. At least one mounting location suitable for mounting an electronic component (e.g., IC chips and/or capacitors) is formed in the second dielectric layer. Pins, ball grid array, land grid array or column grid array connections may be attached to the bottom layer of the ceramic base.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
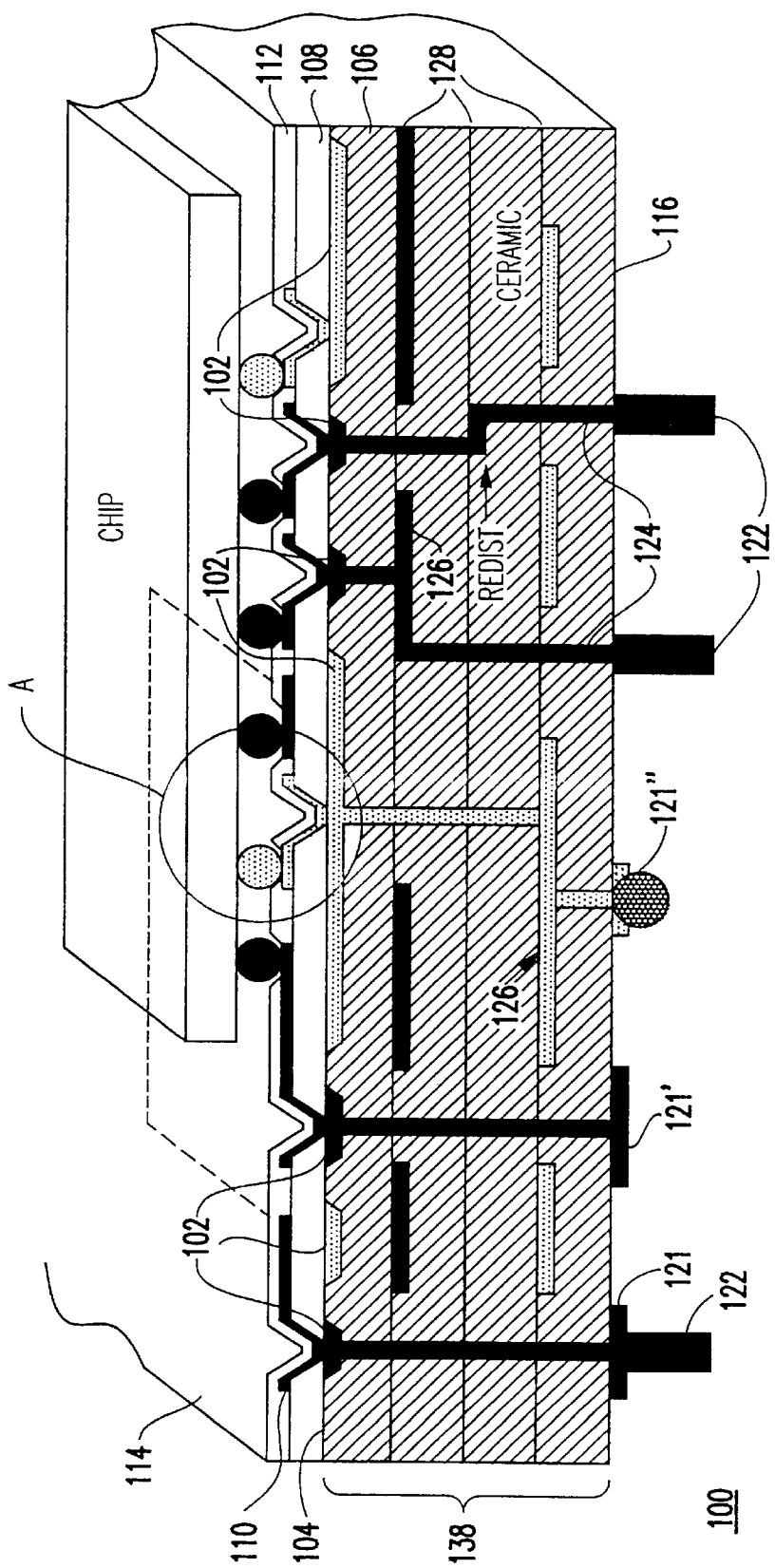
FIG. 1 is an isometric view, partially in cross section, of a preferred embodiment ceramic carrier.
Figure 1A:
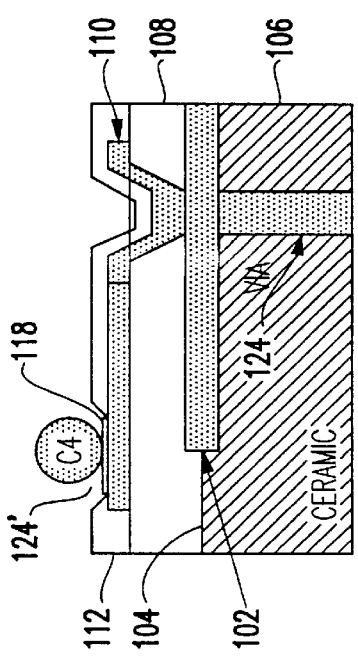
FIG. 1A is an enlarged cross-sectional view of part of the ceramic carrier shown in FIG. 1.

Referring now to the drawings, and more particularly to FIG. 1, there is a preferred embodiment ceramic carrier 100. The carrier includes a sintered reference, conductor pattern layer 102, that is a thick film layer, on a top surface 104 or, embedded in the top surface 104 of a top ceramic layer 106, as particularly shown in FIG. 1A. A thin film (TF) dielectric layer 108 is formed on the pattern layer 102. This first dielectric or insulating layer 108, preferably of polyimide, formed on the pattern layer 102, isolates the sintered pattern layer 102 from a wiring layer 110 formed on the first dielectric layer 108. Both dielectric layer 108 and wiring layer 110 are defined by well-known thin film techniques. If desired, additional wiring layers 110 may be included, suitably separated by additional dielectric layers. A passivation layer 112 formed on wiring layer 110 passivates and isolates wiring layer 110.

Optionally, a surface conductor layer may be formed on the top surface 114 and/or bottom surface 116 (or both) of the carrier 100. A joining pad layer 118 may be formed on the top surface 114. A conductor layer 120 including pads 121, 121', 121" for external connections, for example for pins 122, may be formed on the bottom surface 116 of the ceramic carrier 100.

Joining pads 118 in surface vias 124' opened through the passivation layer 112 on the top surface 114 may provide suitable sites for mounting IC chips or other surface mountable components (not shown) such as capacitors or resistors. By forming the joining pads 118 of an appropriate metal on the top and bottom surfaces 114 and 116, components may be mounted thereto using any well known surface mount technique, such as wire bonding or controlled collapse chip connection (C4). The surface joining pads 118 are layered metal pads. For wire bonding, the preferred joining pads 118 include a gold layer such as Cu/Au, Cu/Ni/Au or Cu/Ti/Au, or alternately the pads 118 may be of Cu or Al. Using C4s, the preferred joining pads 118 are Cu/Ni/Au or Cu/Au, or alternately the pads 118 may be Cu/Co/Au.

Pads in the conductor layer 120 on the ceramic carrier's bottom surface 116 may be braze pads 121 for attaching pins 122 for pin grid array (PGA) attachment. Alternatively, the pads may be direct mount pads 121' for directly attaching the module 100 onto a printed circuit board. Also, the pads may be solder attach pads 121", used in, for example, what is commonly referred to in the art as land grid array (LGA), ball grid array (BGA), column grid array (CGA) or miniBGA. Although in the example of FIG. 1, all three types of pads are shown, typically, if pads are included, only one type would be selected and included.

Interlevel vias 124 include capture pads 126 at intermediate layers 128 and at either end to allow for level to level alignment relaxation. The capture pads 126 assure that through-vias, filled with metal and passing through one or more layers of the ceramic stack, line up.

Figure 2:
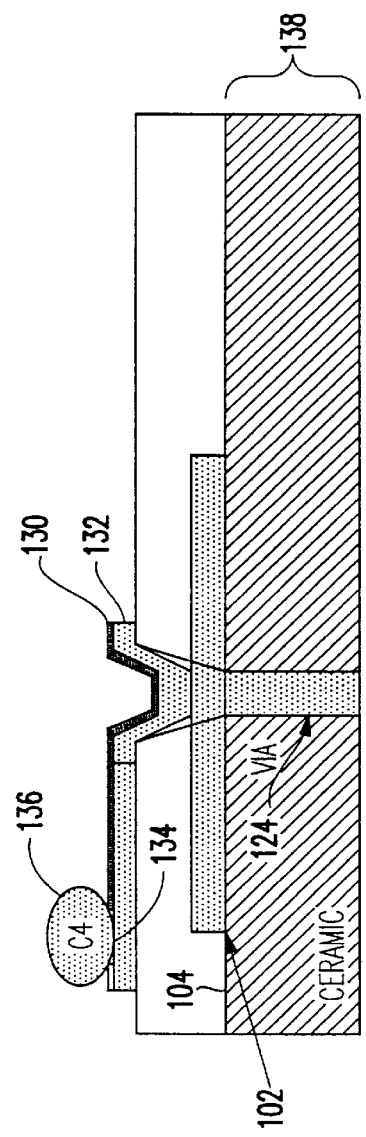
FIG. 2 is a view of cross sectional area A of FIG. 1 in an alternate embodiment.

Although, surface passivation is preferred, it may be omitted and solder dams of Cr used instead, as in the example of FIG. 2. FIG. 2 represents the expanded area of FIG. 1A with solder connections formed using solder dams. Solder dams are formed by etching a pattern into a layered metal of at least two layers, wherein solder will not adhere to the surface metal layer but may adhere to subsurface layers. Preferably, the surface layer 130 is Cr and the preferable subsurface layer 132 material is Cu or Au. Thus, by selectively exposing the appropriate areas 134 of the subsurface layer 132, known as solder vias, through the surface plating layer 130, solder 136 collects in the opened solder vias 134 but, does not accumulate on the plating layer 130.

Figure 3A:
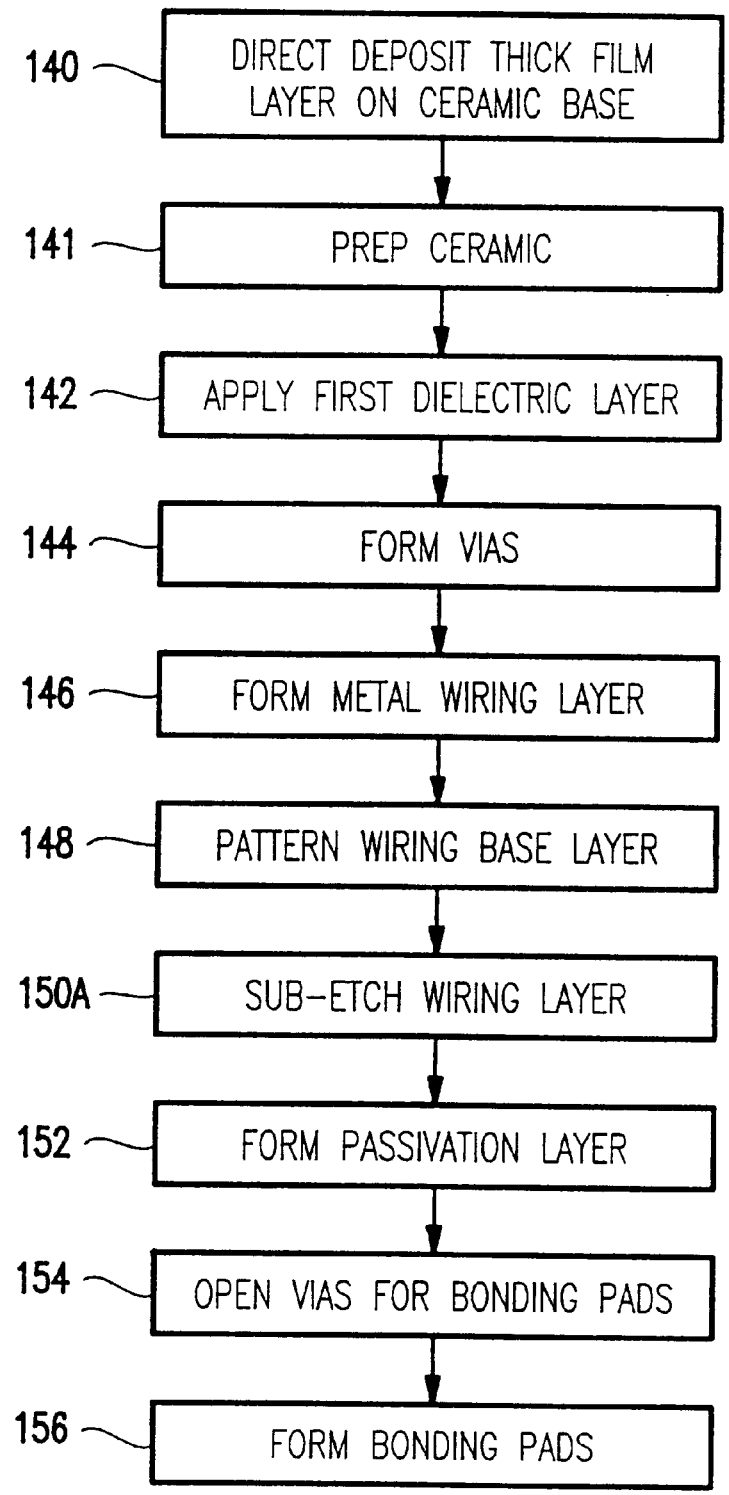
FIG. 3A–B are flow charts for applying TF layers according to two preferred embodiments of the present invention.
Figure 3B:
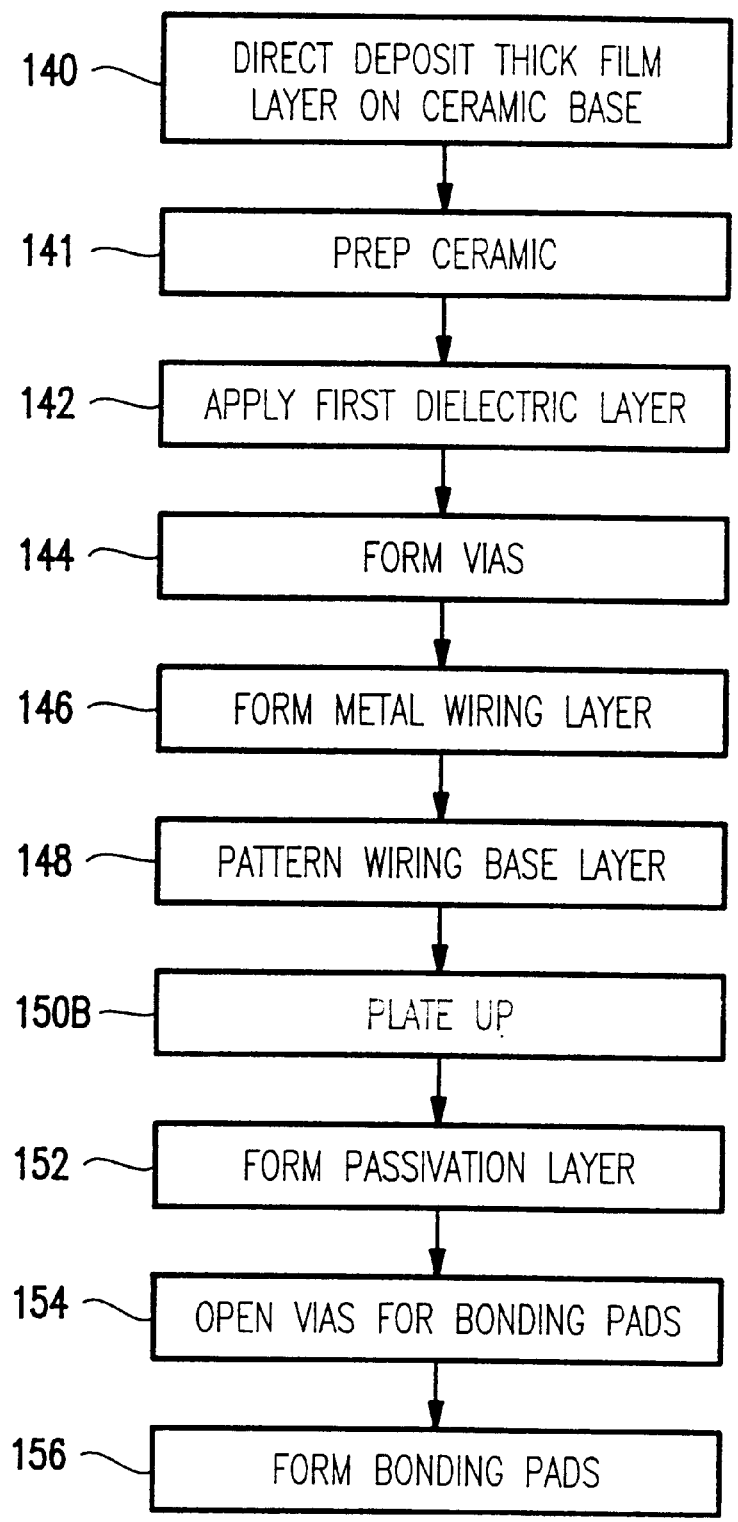

A preferred embodiment module may be formed on a ceramic base 138 according to one of two preferred embodiment processes as represented in the flow charts in FIGS. 3A and 3B. Since the individual steps are identical, no distinction is made between FIG. 3A or 3B in the description hereinbelow unless noted otherwise.

First, in step 140, the surface wiring 102 is formed on the base ceramic 138 and, then, in step 141, it is cleaned for applying subsequent TF layers. The application or intended use of the particular substrate 138 determines the preferable ceramic material type for the carrier layers. Typical ceramic materials include alumina, alumina/glass, aluminum nitride, glass ceramic or, berylia (BeO). The conductor layers 102 may be printed with a metal paste. The type of ceramic material determines what is an appropriate metal paste. Thus, the metal paste may be molybdenum, copper, tungsten, nickel, silver, gold or alloys thereof.

As described above, the TF layers of the preferred embodiment carrier 100 are formed on a surface layer 106 of a multilayered ceramic base 138. The ceramic base 138 is formed using an appropriate typical ceramic substrate fabrication process. A conductor layer 102 is applied on the top surface 104 of surface ceramic layer 106. The preferred method of applying the conductor layer 102 is screen printing, using a wire mesh mask. Alternatively, the conductor may be applied by other appropriate screen printing techniques such as using a metal stencil mask for screening, or using a decal process.

After printing, the conductor layer 102 may be co-fired with the ceramic body 138 or, applied to a fired ceramic base 138 and re-fired. The typical fired thickness of a conductor thus formed is 3–30 micrometers ($\mu$m). If the conductor layer is co-fired, the co-fired conductor may be embedded into the ceramic surface 104, which reduces surface topology variations. Typically, such a co-fired conductor extends from the surface 0–10 $\mu$m.

Having thus formed the conductor layer 102, the substrate is cleaned for forming the subsequent TF layers. An appropriate solution is used to clean the fired (sintered) ceramic substrates 138 by a suitable cleaning method, such as are known in the art. The cleaned substrates 138 are rinsed, finally, with deionized (DI) water. Firing the patterned substrate may result in some pattern distortion. So, after cleaning and rinsing in step 140, if needed, the substrate 138 is mapped. Mapping refers to photo-lithographically reading and mapping the actual pattern from the substrate surfaces 114, 116. If desired, mapped substrates 138 may be stockpiled and set aside for later use.

Next, the first thin dielectric layer 108 is formed on one of these mapped substrates 138 in step 142. This first dielectric layer 108 may be formed by any suitable method currently practiced in the art. However, in the preferred embodiment method, a polymeric solution is spun on or sprayed on, baked and then, cured at appropriate temperatures. Spin apply or spray application solutions are well known. For example, dielectric materials that may be used to form the thin dielectric layer 108 include polyimide solutions, high temperature polyesters or polyurethane, epoxies, benzo-cylco-butenes (BCB), or silicon containing polyimides, Novolac resins, silicon containing Novolac resins or, plain photosensitive polyimides (PSPI).

In one alternate embodiment, the dielectric layer 108 may be a vapor deposited polymer layer of Parylene or an appropriate polyimide. In another alternate embodiment, the dielectric layer 108 is formed by laminating thick polymer sheets to the cleaned substrates 108 under appropriate pressure and temperature. These laminate sheets are adhesive backed layers of dielectric material such as chemically cured polyimide sheets. Alternatively, the dielectric material may be fluoro-polymers such as polytetrafluoroethylene (PTFE).

Typically, laminated films are thicker (1–2 mils) than vapor deposited or spun on layers, to make the laminate sheets less susceptible to handling damage. Also, the sheets are thicker because, in general, thicker films have fewer defects and pin holes than thinner sheets. Adhesive materials for the laminate sheets are selected as required for temperature stability and bond strength.

Optionally, after laminating these thicker films to ceramic substrates 138, they may be thinned using mechanical compression, lapping/polishing, chemical etching or chemmech polishing. The thick laminate layer may be etchedback using any well known plasma process, e.g., plasma etch (PE) or reactive ion etch (RIE).

In yet another third alternate step, the thin dielectric layer may be an inorganic dielectric layer, deposited by plasma enhanced chemical vapor deposition (PECVD) or standard sputtering techniques. These deposited inorganic materials include $SiO_2$, $Al_2O_3$, $Si_3N_4$, BN, AlN and mixtures thereof.

Next, in step 144, after forming the first dielectric layer 108 interconnect vias 124 are opened through the dielectric layer 108. The vias 124 may be opened by laser ablation; RIE using standard etchable photo resist or non-etchable resist, (other plasma processes may be used for depending upon desired via wall angles); using wet or dry etch processes for $SiO_2$ layers; or, using wet etch develop for PSPI or BCBs.

Next, conducting material is applied for the TF wiring layer 110. The TF wiring layer 110 may be formed either by a "sputter and subetch" technique as in FIG. 3A or, by a plating up process in FIG. 3B. Preferably, the TF wire layer 110 is Cr/Cu/Cr, in which the upper Cr layer is selectively removed and a layer of Au is deposited on the exposed Cu. Alternatively, the TF wire layer 110 is Ti/W followed by Al, which is then covered with the passivation or second dielectric layer 112 and then capped with Cr/Cu/Ni/Au. So, in both preferred methods, in step 146, a base layer of Cr/Cu/Cr or Cr/Cu is sputtered onto the dielectric layer 108. Then, in step 148, the metal base layer is patterned using any well known photolithographic process.

If the sputter and sub-etch technique is used, in step 150A of the preferred embodiment process of FIG. 3A, the metal pattern is sub-etched out of the metal base layer. However, if the plate up technique of FIG. 3B is used, then, in step 150B, metal is patterned and then, the patterned metal is plated with Cu/Ni/Au, Cu/Au or Cu only.

Next, if no additional other wiring layers 110 are to be included, then in step 152, the passivation layer 112 is formed over the TF wiring layer 110. If additional wiring layers 110 are to be included, steps 142–150A/B are repeated. Then, in step 144, vias 124' are opened through the final passivation layer 112 to selectively expose the wiring 110 therebelow. Vias 124' may be opened using laser ablation, wet or dry etch. A finishing conductive layer 118, e.g., Ni or Au, is applied to the exposed metal 110, i.e. over the vias 124' in step 156.

After applying the finishing metal layer 118, in step 156, the chip may be joined directly to the thin film or substrate 138 under appropriate temperature and pressure. Alternatively, the exposed metal (Cr) 110 may be etched, followed by electroless deposition of Ni or Co, followed by thin or thick immersion gold. If the chip is to be attached by wire bonding, the surface can be finished with desired metal, i.e., thick Au on top of Cu or, Al pads for wire bonding when the metal layer 110 is Al.

Thus, the preferred embodiments is a ceramic substrate with the advantages of TF wiring, optimized for cost, performance and chip interconnect reliability. Reliability is improved over prior art substrates because thermal expansion of the ceramic closely matches silicon chips mounted thereon. Large (>20 mm on each side) high power (50–100 Watts) microprocessor chips mounted on preferred embodiment substrates would not experience C4 fatigue, that might otherwise occur from highly unmatched chip/substrate expansion.

Further, the thick film ground plane on the ceramic base ensures improved impedance control, tailorable to specific design impedance goals, e.g., 50–60 ohms ($\Omega$). Additionally, the thick film ground plane reduces switching noise, typically a problem for long unshielded fine line nets in dense wiring structures. Thus, to achieve this thicker ground plane, the preferred embodiment substrate does not require special steps normally necessary for depositing the ground layer onto the ceramic base.

While the invention has been described in terms of preferred embodiments, those skilled in the art will recognize that the invention can be practiced with modification within the spirit and scope of the appended claims.

We claim:

1. A substrate for mounting electronic components thereto, said substrate comprising:
   a layered base of a ceramic material, said layered base having a plurality of ceramic layers which are joined together in a stack, and a plurality of conducting vias passing through said stack from a top to a bottom of said stack, at least one of said plurality of conducting vias having a top at said top of said stack and a bottom at said bottom of said stack where said top and said bottom of said conducting vias are offset from one another relative to said top and said bottom of said stack;
   a first conducting layer on a top surface of said layered base;
   a first dielectric layer of a material different than the ceramic material, said first dielectric layer covering said tope surface and said first conducting layer;
   a second conducting layer on said first dielectric layer, lines in said second conducting layer being connected to lines in said first conducting layer; and
   at least one mounting location on a substrate surface suitable for mounting an electronic component and connecting the mounted electronic to said second conducting layer.

2. The substrate of claim 1 wherein the first dielectric layer is thinner than said plurality of ceramic layers in said layered ceramic base.

3. The substrate of claim 1 wherein the first conducting layer is embedded in said top surface.

4. The substrate of claim 3 wherein the thickness of said first conductor layer is 3–30 $\mu$m.

5. The substrate of claim 3 wherein the first conductor layer extends from said top surface 0–10 $\mu$m.

6. The substrate of claim 1 wherein the first dielectric is a layer of organic dielectric material.

7. The substrate of claim 6 further comprising an adhesive attaching the first dielectric layer to the substrate.

8. The substrate of claim 1 wherein the second conducting layer is a layered metal layer.

9. The substrate of claim 8 wherein the layered metal layer comprises a layer of copper.

10. The substrate of claim 9 wherein the layered metal comprises a layer of gold above said layer of copper.

11. The substrate of claim 9 wherein the layered metal comprises a layer of chrome below said layer of copper.

12. The substrate of claim 10 wherein the layered metal comprises a layer of chrome below said layer of copper.

13. The substrate of claim 10 wherein the layered metal comprises a layer of nickel between said layers of gold and copper.

14. The substrate of claim 9 wherein the layered metal comprises a layer of chrome above said layer of copper.

15. A substrate for mounting electronic components thereto said substrate comprising:
   a base of a ceramic material;
   a first conducting layer on a top surface of said base;
   a first dielectric layer of a material different than the ceramic material, said first dielectric layer covering said top surface and said first conducting layer;
   a second conducting layer on said first dielectric layer, lines in said second conducting layer being connected to lines in said first conducting layer, said conducting layer being a layered metal layer which includes a layer of copper and a second layer of metal selected from the group consisting of gold and chrome over said layer of copper wherein said second layer of metal includes a plurality of solder openings at each said mounting location, said solder openings exposing said layer of copper in said openings, solder adhering to said copper in said solder openings;
   a passivation layer of a material different than said ceramic material, said passivation layer covering said first dielectric layer and said second conducting layer; and
   at least one mounting location on a substrate surface suitable for mounting an electronic component and connecting the mounted electronic to said second conducting layer.

16. The substrate of claim 1 further comprising:
   a second dielectric layer of a material different than the ceramic material, said second dielectric layer covering said first dielectric layer and said second conducting layer; and
   a third conducting layer on said second dielectric layer, lines in said third conducting layer being connected to lines in said first and second conducting layers.

17. The substrate of claim 1 further comprising:
   means for attaching said substrate to a printed circuit board.

18. The substrate of claim 17 wherein the attaching means comprises a plurality of pins at a bottom surface of said base.

19. The substrate of claim 17 wherein the means for attaching the substrate is selected from the group consisting of land grid array (LGA), ball grid array (BGA), column grid array (CGA) and miniBGA.

20. The substrate of claim 1 further comprising a passivation layer of a material different than the ceramic material, said passivation layer covering said first dielectric layer and said second conducting layer.

21. A substrate for mounting electronic components thereto, said substrate comprising:
   a base of a ceramic material;
   a first conducting layer on a top surface of said base;
   a first dielectric layer of a material different than the ceramic material, said first dielectric layer covering said tope surface and said first conducting layer;
   a second conducting layer on said first dielectric layer, lines in said second conducting layer being connected to lines in said first conducting layer;
   a passivation layer of a material different than said ceramic material, said passivation layer covering said first dielectric layer and said second conducting layer;
   a finishing conducting layer on the passivation layer; and
   at least one mounting location on a substrate surface suitable for mounting an electronic component and connecting the mounted electronic to said second conducting layer.

22. The substrate of claim 21 wherein the passivation layer includes a plurality of vias in each said mounting location, any said electronic component mounted in said mounting location being connected to said second conducting layer through said plurality of vias.

23. The substrate of claim 15 wherein said second layer is gold.

24. The substrate of claim 15 wherein said second layer is chrome.

* * * * *